United States Patent
Wu et al.

(10) Patent No.: US 11,251,136 B2
(45) Date of Patent: Feb. 15, 2022

(54) FLIP-CHIP DIE PACKAGE STRUCTURE AND ELECTRONIC DEVICE

(71) Applicant: Huawei Technologies Co., Ltd., Shenzhen (CN)

(72) Inventors: Wei Wu, Shenzhen (CN); Ding Li, Shenzhen (CN); Hongcheng Yin, Shenzhen (CN); Xiongcai Kuang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/038,756

(22) Filed: Sep. 30, 2020

(65) Prior Publication Data

US 2021/0013154 A1 Jan. 14, 2021

Related U.S. Application Data

(63) Continuation of application No. PCT/CN2018/089369, filed on May 31, 2018.

(51) Int. Cl.
*H01L 23/552* (2006.01)
*H01L 23/00* (2006.01)

(52) U.S. Cl.
CPC ............ *H01L 23/552* (2013.01); *H01L 24/14* (2013.01); *H01L 24/16* (2013.01); *H01L 2224/14519* (2013.01); *H01L 2224/16225* (2013.01); *H01L 2924/3025* (2013.01); *H01L 2924/351* (2013.01)

(58) Field of Classification Search
CPC ....... H01L 23/552; H01L 24/14; H01L 24/16; H01L 2224/14519; H01L 2224/16225; H01L 2924/3025; H01L 2924/351

USPC .......................................................... 257/659
See application file for complete search history.

(56) References Cited

U.S. PATENT DOCUMENTS

| | | | |
|---|---|---|---|
| 6,509,640 B1 * | 1/2003 | Li | .................. 257/678 |
| 8,017,436 B1 * | 9/2011 | Huemoeller | ...... H01L 23/49861 |
| | | | 438/107 |
| 9,312,927 B2 | 4/2016 | Bhagat et al. | |
| 9,496,231 B1 | 11/2016 | Tsai et al. | |
| 2007/0132094 A1 * | 6/2007 | Shimura | ............... H01L 23/055 |
| | | | 257/729 |
| 2007/0180981 A1 | 8/2007 | Tapp et al. | |
| 2008/0006773 A1 * | 1/2008 | Rose | ..................... A61B 6/107 |
| | | | 250/336.1 |

(Continued)

FOREIGN PATENT DOCUMENTS

| | | |
|---|---|---|
| CN | 1478299 A | 2/2004 |
| CN | 105428325 A | 3/2016 |
| CN | 107408551 A | 11/2017 |

*Primary Examiner* — Didarul A Mazumder
(74) *Attorney, Agent, or Firm* — Conley Rose, P.C.

(57) ABSTRACT

A flip-chip die package includes a substrate, a die, a plurality of conductive bumps, and a first metal structure, where an upper surface of the die is electrically coupled, using the conductive bumps, to a surface that is of the substrate and that faces the die, and the first metal structure includes a plurality of first metal rods disposed between the substrate and the die, where each first metal rod is electrically coupled to the substrate and the die, and the first metal rods are arranged around a first active functional circuit, and the first active functional circuit includes an electromagnetic radiation capability or an electromagnetic receiving capability in the die.

20 Claims, 13 Drawing Sheets

(56) References Cited

U.S. PATENT DOCUMENTS

2016/0254236 A1 9/2016 Kim et al.
2017/0317166 A1 11/2017 Pei et al.

* cited by examiner

FLIP-CHIP DIE PACKAGE STRUCTURE AND ELECTRONIC DEVICE

CROSS-REFERENCE TO RELATED APPLICATION

This application is a continuation of International Patent Application No. PCT/CN2018/089369 filed on May 31, 2018, which is hereby incorporated by reference in its entirety.

TECHNICAL FIELD

This application relates to the field of semiconductor technologies, and in particular, to a flip-chip die package structure and an electronic device.

BACKGROUND

As die integration constantly increases, there are a growing number of integrated functional circuits in a die and a distance between the functional circuits becomes smaller. Therefore, a problem of interference from a functional circuit (referred to as an interference source) with an electromagnetic radiation capability to a functional circuit (referred to as a susceptor) with an electromagnetic receiving capability becomes more prominent. In a die packaged using a flip-chip technology, the problem of interference from an interference source to a susceptor is particularly serious.

A die packaged using a flip-chip technology is referred to as a flip-chip die. For example, a possible package structure of the flip-chip die may be shown in FIG. 1. An upper surface of the die is connected to a top layer (that is, a surface that is of a substrate and that faces the die) of the substrate using a conductive bump, and a resonant cavity is formed between the upper surface of the die, the top layer of the substrate, and the conductive bump. The upper surface of the die is a surface that includes a die solder pad. In the package structure shown in FIG. 1, an electromagnetic wave radiated by an interference source is coupled to a susceptor using the resonant cavity, causing serious interference to the susceptor.

In conclusion, a flip-chip die package solution is urgently needed to reduce interference from an interference source to a susceptor in a die and improve electromagnetic isolation between the interference source and the susceptor.

SUMMARY

Embodiments of this application provide a flip-chip die package structure and an electronic device, to improve electromagnetic isolation between an interference source and a susceptor in a die and reduce interference from the interference source to the susceptor.

According to a first aspect, an embodiment of this application provides a flip-chip die package structure, including a substrate, a die, a plurality of conductive bumps, and a first metal structure, where an upper surface of the die is electrically connected, using the plurality of conductive bumps, to a surface that is of the substrate and that faces the die, and the upper surface is a surface that includes a die solder pad, and the first metal structure includes a plurality of first metal rods, each of the plurality of first metal rods is disposed between the substrate and the die, each first metal rod is electrically connected to the substrate and the die, the plurality of first metal rods are arranged around a first active functional circuit, and the first active functional circuit is a circuit with an electromagnetic radiation capability or an electromagnetic receiving capability in the die.

That is, the first active functional circuit may be an interference source, a susceptor, or both an interference source and a susceptor.

According to the flip-chip die package structure provided in the first aspect, the plurality of first metal rods are arranged around the first active functional circuit, and the plurality of first metal rods can change a resonance characteristic of a resonant cavity formed between the substrate, the die, and the conductive bumps. When the first active functional circuit serves as an interference source, the first metal structure can reduce electromagnetic interference from the first active functional circuit to another functional circuit (for example, a susceptor) in the die. When the first active functional circuit serves as a susceptor, the first metal structure can reduce electromagnetic interference from another functional circuit (for example, an interference source) to the first active functional circuit in the die. Therefore, according to the flip-chip die package structure provided in the first aspect, interference from an interference source to a susceptor in the die can be reduced, and electromagnetic isolation between the interference source and the susceptor can be improved.

In addition, the flip-chip die package structure provided in the first aspect may further include a filling layer, and the filling layer may be configured to convert electromagnetic waves or an electromagnetic wave radiated or received by the first active functional circuit into thermal energy.

Disposing the filling layer between the substrate and the die can convert the electromagnetic waves or electromagnetic wave radiated or received by the first active functional circuit into thermal energy such that electromagnetic interference from an interference source to a susceptor can be further reduced, and electromagnetic isolation between the interference source and the susceptor in the package structure can be improved. In addition, the filling layer can further stick the substrate, the die, the plurality of conductive bumps, and the first metal structure together, to reduce stress generated on the conductive bumps and the first metal structure due to a mismatch between coefficients of thermal expansion of the substrate and the die, and increase thermal fatigue lives of the conductive bumps and the first metal structure, thereby improving reliability of the package structure.

In a possible design, the filling layer may further include an electromagnetic loss particle, and the electromagnetic loss particle is configured to convert the electromagnetic waves or electromagnetic wave radiated or received by the first active functional circuit into thermal energy.

In the foregoing solution, the electromagnetic loss particle in the filling layer is used to convert the electromagnetic waves or electromagnetic wave radiated or received by the first active functional circuit into thermal energy.

It should be noted that in this embodiment of this application, it is the only limit that the plurality of first metal rods are arranged around the first active functional circuit, and a spacing between the plurality of first metal rods, a distance between the first metal rods and the first active functional circuit, and the like are not limited.

For example, the plurality of first metal rods may be sequentially arranged around the first active functional circuit at equal intervals of a first spacing.

Arranging the plurality of first metal rods at equal intervals is not only technically easy to implement but also can evenly reduce electromagnetic interference between the first active functional circuit and other active functional circuits.

It is easy to understand that in the foregoing implementation, a smaller first spacing indicates a better effect of reducing electromagnetic interference between the first active functional circuit and another active functional circuit by the first metal structure. In addition, a maximum value of the first spacing may be one tenth of a wavelength of the electromagnetic wave radiated or received by the first active functional circuit.

In the flip-chip die package structure provided in the first aspect, the first metal structure includes the plurality of first metal rods, and the plurality of first metal rods may be arranged in different manners. The following lists two of the manners.

Manner 1:

The plurality of first metal rods surround the first active functional circuit.

Herein, "surround" is a relative concept. Because the plurality of first metal rods are spaced apart, it is easy to imagine that it is difficult to totally isolate the first active functional circuit using the plurality of first metal rods. Herein, "surround" means that the plurality of first metal rods are arranged in all directions around the first active functional circuit, that is, the plurality of first metal rods are spaced apart at equal intervals, and there is no obvious "gap" between the plurality of first metal rods arranged around the first source switching node.

In manner 1, the plurality of first metal rods are arranged around the first active functional circuit, that is, the plurality of first metal rods surround the first active functional circuit. When the first active functional circuit serves as an interference source, in this manner, interference from electromagnetic waves radiated by the first active functional circuit around to susceptors in all directions can be reduced. When the first active functional circuit serves as a susceptor, in this manner, interference from interference sources in all directions around the first active functional circuit to the first active functional circuit can be reduced. Therefore, regardless of a quantity of functional circuits included in the die and locations of the functional circuits, in manner 1, electromagnetic interference around the first active functional circuit can be reduced, thereby improving electromagnetic isolation between an interference source and a susceptor in the die.

Manner 2:

The plurality of first metal rods are arranged around the first active functional circuit in a region in which magnetic field strength is greater than a preset value.

The preset value may be set based on a requirement. It is easy to imagine that through setting of the preset value, the plurality of first metal rods may be arranged around the first active functional circuit only in some directions (that is, directions in which magnetic field strength is relatively strong) of the first active functional circuit.

In manner 2, the plurality of first metal rods are disposed only in the region in which the magnetic field strength is greater than the preset value. Therefore, electromagnetic interference in the region in which the magnetic field strength is relatively strong can be reduced using the plurality of first metal rods. When the first active functional circuit serves as an interference source, in this manner, interference from an electromagnetic wave radiated by the first active functional circuit to a susceptor in the region in which the magnetic field strength is relatively strong can be reduced. When the first active functional circuit serves as a susceptor, in this manner, interference from an interference source in the region in which the magnetic field strength is relatively strong around the first active functional circuit to the first active functional circuit can be reduced. In conclusion, in manner 2, electromagnetic interference in the region in which the magnetic field strength is relatively strong around the first active functional circuit can be reduced, thereby improving electromagnetic isolation between an interference source and a susceptor in the package structure.

In addition, in manner 2, the plurality of first metal rods are disposed only in the region in which the magnetic field strength is greater than the preset value. Therefore, a quantity of first metal rods disposed in manner 2 is usually less than a quantity of first metal rods disposed in manner 1. That is, in manner 2, a structure of the first metal structure can be simplified such that space of the package structure is reduced.

In a possible design, the flip-chip die package structure may further include a second active functional circuit, and the second active functional circuit is a circuit with an electromagnetic radiation capability or an electromagnetic receiving capability in the die.

That is, after the first metal structure is disposed for the first active functional circuit in the package structure, a corresponding metal structure may not be disposed for the second active functional circuit. Because the first metal structure has been disposed around the first active functional circuit, the first metal structure can reduce electromagnetic interference in a transmission or receiving path of an electromagnetic wave. Even if no metal structure is disposed around the second active functional circuit, electromagnetic interference between the second active functional circuit and the first active functional circuit is reduced in comparison with an existing solution.

Certainly, in this embodiment of this application, to further improve electromagnetic isolation between an interference source and a susceptor, a second metal structure may also be disposed for the second active functional circuit. Further, the second metal structure may include a plurality of second metal rods. Each of the plurality of second metal rods is disposed between the substrate and the die, each second metal rod is electrically connected to the substrate and the die, and the plurality of second metal rods are arranged around the second active functional circuit. For another manner of disposing the second metal structure, refer to related descriptions of the first metal structure. Details are not described herein again.

Further, if the die includes a plurality of interference sources and a plurality of susceptors, corresponding metal structures may be disposed for each interference source and each susceptor, to further improve electromagnetic isolation between the interference source and the susceptor.

According to a second aspect, an embodiment of this application provides an electronic device. The electronic device includes the flip-chip die package structure provided in any one of the first aspect and the possible designs of the first aspect.

For example, the electronic device includes but is not limited to a terminal device such as a smartphone, a smart television (TV), a smart TV set-top box, a personal computer (PC), a wearable device, or an intelligent broadband device, a telecommunications device such as a wireless network, a fixed network, or a server, and an electronic device such as a die module or a memory.

DESCRIPTION OF EMBODIMENTS

As described in the background, in a flip-chip die package structure, a problem of interference from an interference source to a susceptor becomes more prominent because in the flip-chip die package structure, a resonant cavity is formed between an upper surface of a die, a top layer of a substrate, and a conductive bump. An electromagnetic wave radiated by a functional circuit with a specific electromagnetic radiation capability is coupled to another functional circuit with a specific electromagnetic receiving capability using the resonant cavity, reducing electromagnetic isolation between the two functional circuits. Consequently, interference from an interference source to a susceptor in the die is serious. The functional circuit with an electromagnetic radiation capability may be an interference source, and the functional circuit with an electromagnetic reception capability may be a susceptor.

Figure 1:
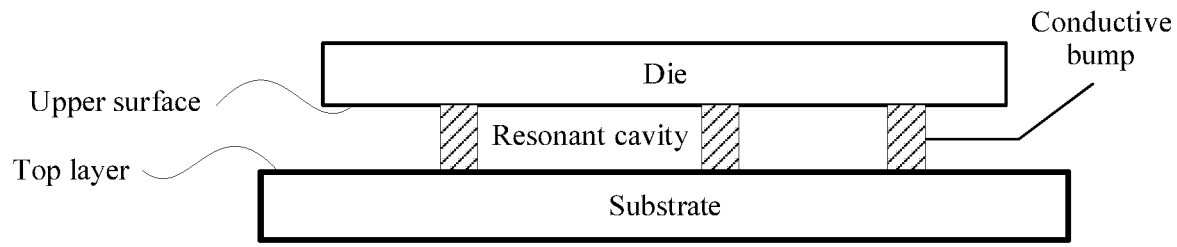
FIG. 1 is a schematic structural diagram of a flip-chip die package structure.
Figure 2:
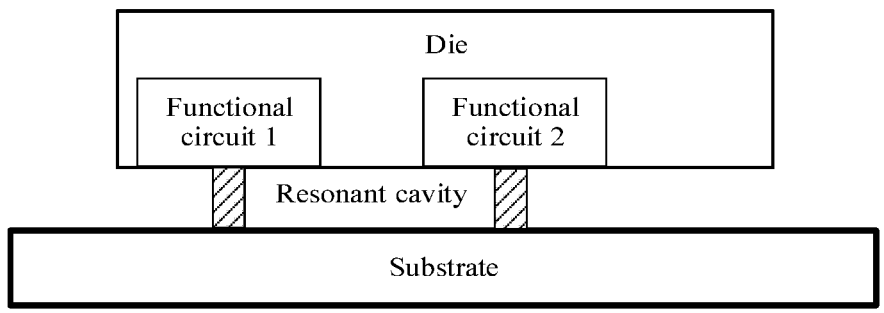
FIG. 2 is a schematic structural diagram of the first flip-chip die package structure according to an embodiment of this application.

The die may include one or more functional circuits. Each of these circuits has a specific electromagnetic radiation capability, a specific electromagnetic receiving capability, or both an electromagnetic radiation capability and an electromagnetic receiving capability. In a flip-chip die package structure shown in FIG. 2, a die includes a functional circuit 1 and a functional circuit 2, where the functional circuit 1 has a specific electromagnetic radiation capability, and the functional circuit 2 has a specific electromagnetic receiving capability. The functional circuit 1 and the functional circuit 2 are separately electrically connected to a substrate using conductive bumps. Because a resonant cavity is formed between an upper surface (that is, a surface that includes a die solder pad) of the die, a top layer (that is, a surface that is of the substrate and that faces the die) of the substrate, and two conductive bumps, an electromagnetic wave radiated by the functional circuit 1 is coupled to the functional circuit 2 using the resonant cavity, causing electromagnetic wave interference to the functional circuit 2, and reducing electromagnetic isolation between the functional circuit 1 and the functional circuit 2.

To resolve the foregoing problems, embodiments of this application provide a flip-chip die package structure and an electronic device, to improve electromagnetic isolation between an interference source and a susceptor in a die and reduce interference from the interference source to the susceptor. The flip-chip die package structure provided in the embodiments of this application may be widely applied to various electronic devices and electronic components, including but not limited to terminal devices such as a smartphone, a smart TV, a smart TV set-top box, a PC, a wearable device, and an intelligent broadband device, telecommunications devices such as a wireless network, a fixed network, and a server, and electronic components such as a die module and a memory.

To make the objectives, technical solutions and advantages of the embodiments of this application clearer, the following further describes the embodiments of this application in detail with reference to the accompanying drawings.

It should be noted that "a plurality of" means "two or more" in the embodiments of this application. In addition, it should be understood that, in the description of the embodiments of this application, terms such as "first" and "second" are only used for a purpose of distinguishing between descriptions, but cannot be understood as indication or implication of relative importance, and cannot be understood as an indication or implication of a sequence.

Figure 3:
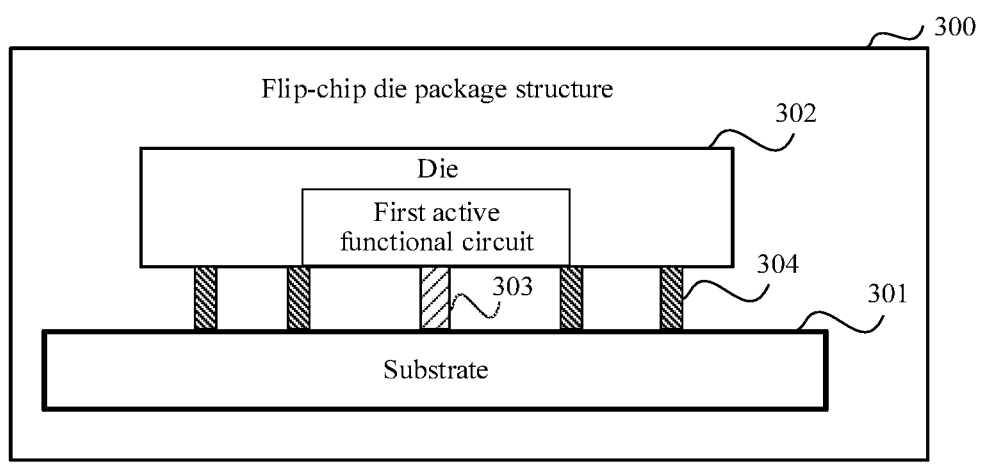
FIG. 3 is a schematic structural diagram of the second flip-chip die package structure according to an embodiment of this application.

FIG. 3 is a schematic structural diagram of a flip-chip die package structure according to an embodiment of this application. The flip-chip die package structure 300 includes a substrate 301, a die 302, a plurality of conductive bumps 303, and a first metal structure 304.

An upper surface of the die 302 is electrically connected, using the plurality of conductive bumps 303, to a surface (that is, the foregoing top layer of the substrate) that is of the substrate 301 and that faces the die 302, and the upper surface of the die 302 is a surface that includes a die solder pad. The die solder pad is connected to an input/output pin of the die 302, to implement input/output of an electrical signal.

The first metal structure 304 includes a plurality of first metal rods, each of the plurality of first metal rods is disposed between the substrate 301 and the die 302, each first metal rod is electrically connected to the substrate 301 and the die 302, the plurality of first metal rods are arranged around a first active functional circuit, and the first active functional circuit is a circuit with an electromagnetic radiation capability or an electromagnetic reception capability in the die 302.

It should be noted that in the flip-chip die package structure 300, the die 302 is electrically connected to the substrate 301 using the conductive bump 303, and the die 302 is further electrically connected to the substrate 301 using the first metal rod. A difference between the two electrical connections may be understood as follows.

The die 302 is electrically connected to the substrate 301 using the conductive bump 303, and the conductive bump 303 may be connected to the input/output pin of the die 302 using the die solder pad, to transmit an electrical signal input/output by the die 302. Therefore, the die 302 is electrically connected to the substrate 301 using the conductive bump 303, to implement a function of the die 302.

The die 302 is electrically connected to the substrate 301 using the first metal rod, and the first metal rod may be connected to a pin with an undefined function, a ground pin, or the like in the die 302, to destroy a resonant cavity formed between the conductive bump 303, the substrate 301, and the die 302. It can be easily learned that no wanted electrical signal used to implement a function of the die is transmitted in the first metal rod. Therefore, the die 302 is electrically connected to the substrate 301 using the first metal rod, to reduce electromagnetic interference between the first active functional circuit and another active functional circuit.

In this embodiment of this application, an active functional circuit is a functional circuit that includes a power supply. The die 302 may include one or more active functional circuits. Any one of these active functional circuits may be an interference source, a susceptor, or both an interference source and a susceptor. An electromagnetic wave radiated by the interference source may cause electromagnetic interference to the susceptor. The first active functional circuit in this embodiment of this application is an active functional circuit with an electromagnetic radiation capability or an electromagnetic receiving capability. That is, the first active functional circuit may be an interference source, a susceptor, or both an interference source and a susceptor.

In addition, in this embodiment of this application, the upper surface of the die 302 is electrically connected, using the plurality of conductive bumps 303, to the surface that is of the substrate 301 and that faces the die 302, and the upper surface of the die 302 is the surface that includes the die solder pad. That is, the die 302 is packaged using a flip-chip technology. In addition, in the flip-chip die package structure 300 shown in FIG. 3, only one of the plurality of conductive bumps 303 is shown. In actual implementation, the package structure 300 may include a plurality of functional circuits, and the plurality of functional circuits are electrically connected, using different conductive bumps, to the surface that is of the substrate 301 and that faces the die 302. That is, the package structure 300 may include a plurality of conductive bumps.

The conductive bump 303 shown in FIG. 3 may be configured to implement an electrical connection between the first active functional circuit and the substrate 301. For the first active functional circuit in the plurality of functional circuits, the resonant cavity is formed between the conductive bump 303 configured to implement the connection between the first active functional circuit and the substrate 301, the die 302, and another conductive bump (configured to implement a connection between another functional circuit in the die 302 and the substrate 301), reducing electromagnetic isolation between the first active functional circuit and the another functional circuit.

The first metal structure 304 disposed (that is, the plurality of first metal rods disposed) around the first active functional circuit can change a resonance characteristic of the resonant cavity formed between the substrate 301, the die 302, and the conductive bump 303. When the first active functional circuit serves as an interference source, the first metal structure 304 can reduce electromagnetic interference from the first active functional circuit to another functional circuit (for example, a susceptor) in the die 302. When the first active functional circuit serves as a susceptor, the first metal structure 304 can reduce electromagnetic interference from another functional circuit (for example, an interference source) to the first active functional circuit in the die 302. Therefore, according to the flip-chip die package structure 300 shown in FIG. 3, electromagnetic interference from an interference source to a susceptor in the die 302 can be reduced, and electromagnetic isolation between the interference source and the susceptor can be improved.

It should be noted that in this embodiment of this application, it is the only limit that the plurality of first metal rods are arranged around the first active functional circuit, and other characteristics such as a quantity of first metal rods and a shape and a material of the first metal rod are not limited. For example, there may be four, five, six, seven, or eight first metal rods, the first metal rod may be a circular metal rod, a square metal rod, or a metal rod of another shape, and the material of the first metal rod may be tin, copper, or another metal with electromagnetic conduction performance.

In addition, a spacing between the plurality of first metal rods is not limited in this embodiment of this application. For example, in this embodiment of this application, the plurality of first metal rods may be sequentially arranged around the first active functional circuit at equal intervals of a first spacing. That is, the plurality of first metal rods may be arranged at equal intervals.

The plurality of first metal rods are arranged at equal intervals mainly for the following considerations. Arranging the plurality of first metal rods at equal intervals is technically easy to implement. In addition, arranging the plurality of first metal rods at equal intervals can further evenly reduce electromagnetic interference between the first active functional circuit and other active functional circuits.

Further, when the plurality of first metal rods are arranged at equal intervals, the first spacing may be less than one tenth of a wavelength of an electromagnetic wave radiated or received by the first active functional circuit. For example, when the first active functional circuit serves as an interference source, the first spacing may be less than one tenth of a wavelength of an electromagnetic wave radiated by the first active functional circuit. When the first active functional circuit serves as a susceptor, the first spacing may be less than one tenth of a wavelength of an electromagnetic wave received by the first active functional circuit. When the first active functional circuit serves as both an interference source and a susceptor, the first spacing may be less than one tenth of a wavelength of an electromagnetic wave radiated by the first active functional circuit, or may be less than one tenth of a wavelength of an electromagnetic wave received by the first active functional circuit, or may be less than a smaller value in one tenth of a wavelength of an electromagnetic wave radiated by the first active functional circuit and one tenth of a wavelength of an electromagnetic wave received by the first active functional circuit.

For ease of description, in the embodiments of this application and the accompanying drawings, an example in which the plurality of first metal structures are arranged at equal intervals is used. In actual implementation, alternatively, the plurality of first metal rods may be arranged at unequal intervals. When the plurality of first metal rods are arranged at unequal intervals, a spacing between adjacent first metal rods may be less than one tenth of the wavelength of the electromagnetic wave radiated or received by the first active functional circuit.

Figure 4:
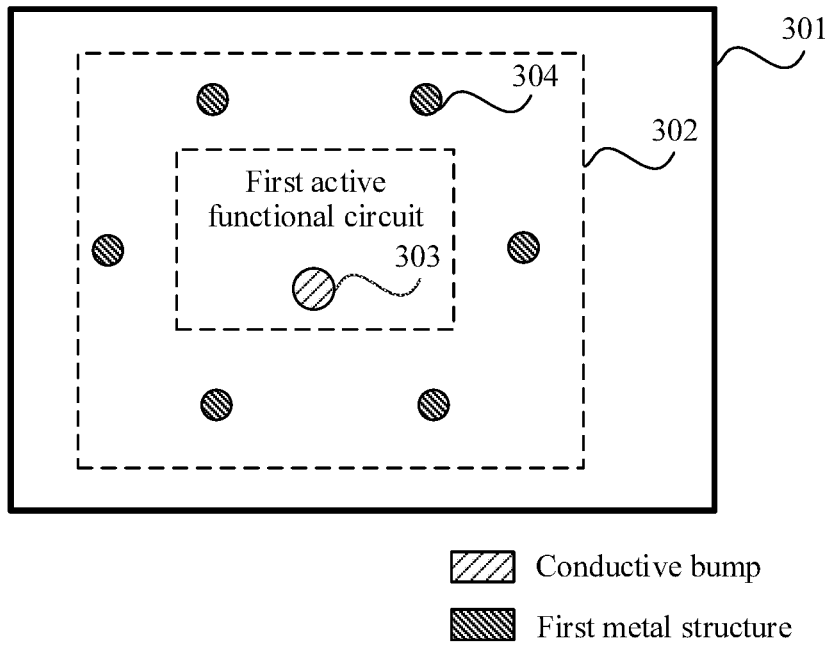
FIG. 4 is a schematic structural diagram of the third flip-chip die package structure according to an embodiment of this application.

A top view of the flip-chip die package structure 300 shown in FIG. 3 may be shown in FIG. 4. In the flip-chip die package structure 300 shown in FIG. 3 and FIG. 4, an example in which there are six first metal rods and the first metal rod is a circular metal rod is used. In addition, to more clearly indicate a location relationship between the first metal rod and the conductive bump 303 (configured to connect the first active functional circuit and the substrate 301) in FIG. 4, the die 302 is shown in a dashed line. In addition, in the flip-chip die package structure 300 shown in FIG. 4, the plurality of first metal rods are evenly disposed around the conductive bump 303.

In actual implementation, a location relationship between the plurality of first metal rods and the conductive bump 303 in this embodiment of this application is not limited to the manner shown in FIG. 3 or FIG. 4. The plurality of first metal rods only need to be arranged around the first active functional circuit.

Figure 5:
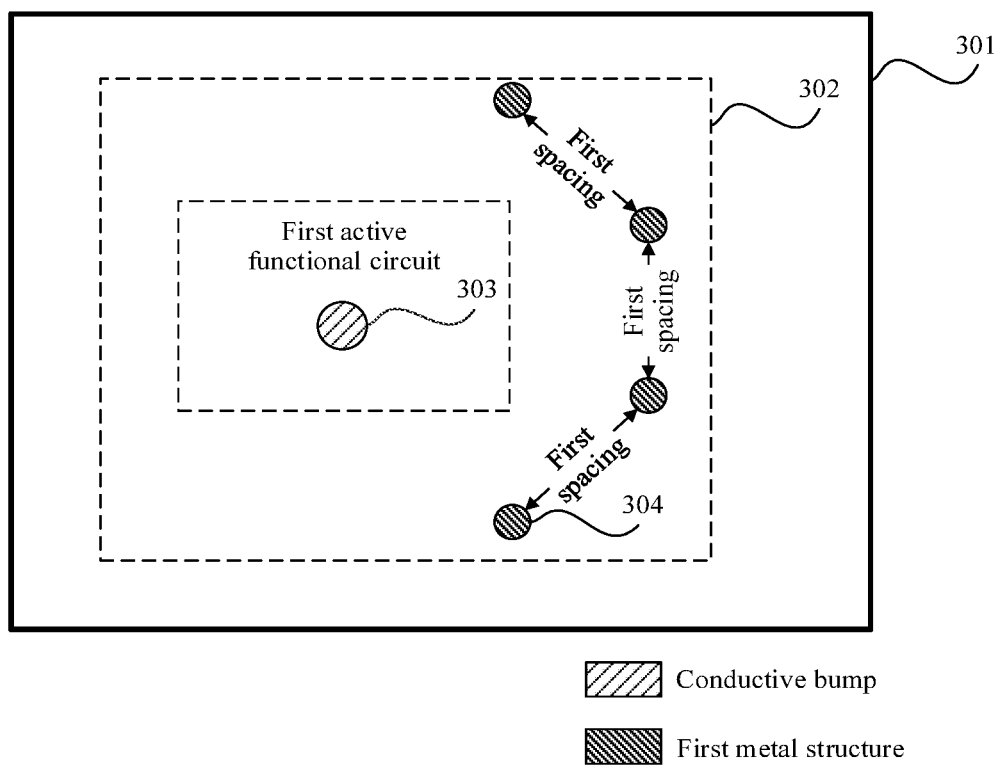
FIG. 5 is a schematic diagram of the first location relationship between first metal rods and a conductive bump according to an embodiment of this application.

One example may be as follows. The location relationship between the plurality of first metal rods and the conductive bump 303 may be shown in FIG. 5. There are four first metal rods, and the four first metal rods are sequentially arranged on the right side of the first active functional circuit at equal intervals of the first spacing.

Figure 6:
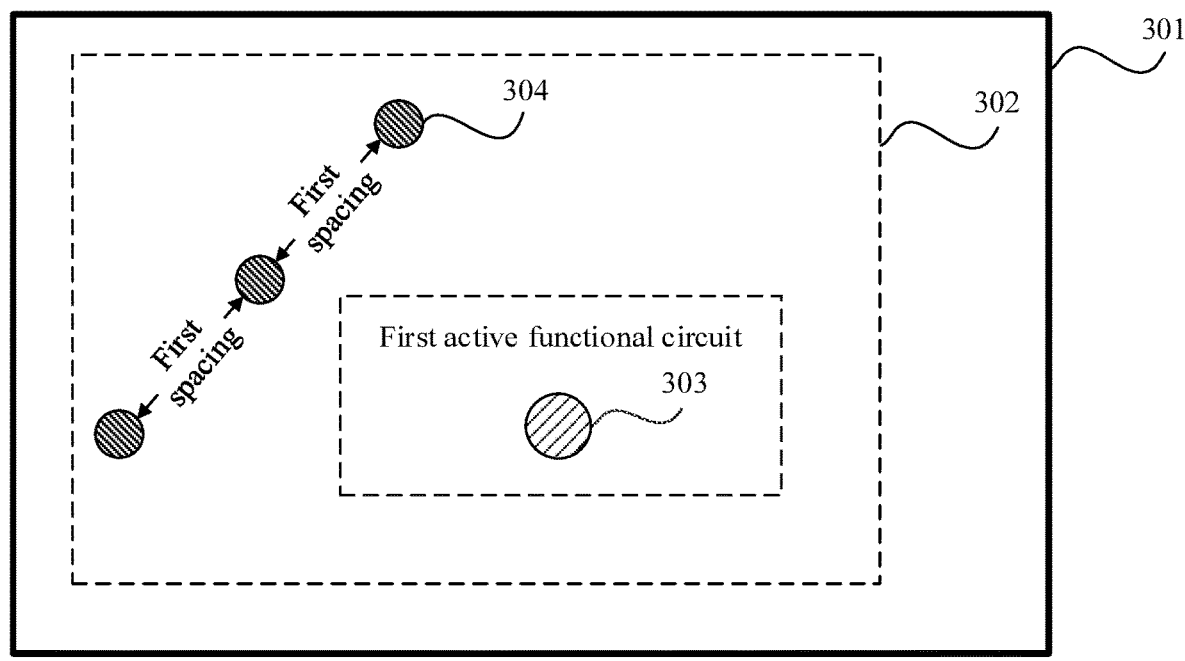
FIG. 6 is a schematic diagram of the second location relationship between first metal rods and a conductive bump according to an embodiment of this application.

Another example may be as follows. The location relationship between the plurality of first metal rods and the conductive bump 303 may be shown in FIG. 6. There are three first metal rods, and the three first metal rods are sequentially arranged on the upper left side of the first active functional circuit at equal intervals of the first spacing.

Still another example may be as follows. The location relationship between the plurality of first metal rods and the conductive bump 303 may be shown in FIG. 7. There are eight first metal rods, and the eight first metal rods are sequentially arranged around the first active functional circuit at equal intervals of the first spacing. A spacing between any two adjacent first metal rods is the first spacing.

In addition, the flip-chip die package structure 300 may further include a filling layer, and the filling layer is configured to convert electromagnetic waves or an electromagnetic wave radiated or received by the first active functional circuit into thermal energy.

Disposing the filling layer between the substrate 301 and the die 302 can convert the electromagnetic waves or electromagnetic wave radiated or received by the first active functional circuit into thermal energy such that electromagnetic interference from an interference source to a susceptor can be further reduced, and electromagnetic isolation between the interference source and the susceptor in the package structure 300 can be improved. In addition, disposing the filling layer between the substrate 301 and the die 302 can stick the substrate 301, the die 302, the conductive bump 303, and the first metal structure 304 together, to reduce stress generated on the conductive bump 303 and the first metal structure 304 due to a mismatch between coefficients of thermal expansion of the substrate 301 and the die 302, and increase thermal fatigue lives of the conductive flip-chip die package structure 300.

Further, the filling layer may further include an electromagnetic loss particle, and the electromagnetic loss particle is configured to convert the electromagnetic waves or electromagnetic wave radiated or received by the first active functional circuit into thermal energy.

In the foregoing solution, the electromagnetic loss particle in the filling layer may be used to convert the electromagnetic waves or electromagnetic wave radiated or received by the first active functional circuit into thermal energy.

As described above, in this embodiment of this application, the location relationship between the plurality of first metal rods and the conductive bump 303 (configured to implement the electrical connection between the first active functional circuit and the substrate 301) is not limited, and the plurality of first metal rods only need to be arranged around the first active functional circuit.

In this embodiment of this application, the term "around" in "the plurality of first metal rods are arranged around the first active functional circuit" may be understood as. The term "around" may mean that the plurality of first metal rods surround the first active functional circuit, that is, there is no obvious "gap" between the plurality of first metal rods arranged around the first active functional circuit, which is referred to as "fully surrounding". Alternatively, "around" may mean that the plurality of first metal rods are arranged around the first active functional circuit only in some directions of the first active functional circuit, that is, there is an obvious "gap" between the plurality of first metal rods arranged around the first source switching node, which is referred to as "half surrounding". For example, an arrangement manner of the plurality of first metal rods in FIG. 4 may be considered as the "fully surrounding" arrangement manner, and an arrangement manner of the plurality of first metal rods in FIG. 5 may be considered as the "half surrounding" arrangement manner.

In specific implementation, the "fully surrounding" or "half surrounding" arrangement manner may be selected based on factors such as a space limitation of the package structure 300, an electromagnetic isolation requirement of the die 302, and magnetic field strength around the first active functional circuit. The following lists two of the implementations.

Implementation 1:

The plurality of first metal rods may be arranged around the first active functional circuit in the following manner. The plurality of first metal rods surround the first active functional circuit.

In implementation 1, the plurality of first metal rods are arranged around the first active functional circuit, that is, the plurality of first metal rods surround the first active functional circuit. Herein, "surround" is a relative concept. Because the plurality of first metal rods are spaced apart, it is easy to imagine that it is difficult to totally isolate the first active functional circuit using the plurality of first metal rods. Herein, "surround" means that the plurality of first metal rods are arranged in all directions around the first active functional circuit, that is, the plurality of first metal rods are spaced apart at equal intervals, and there is no obvious "gap" between the plurality of first metal rods arranged around the first source switching node, which is the foregoing "fully surrounding" arrangement manner.

When the first active functional circuit serves as an interference source, in this implementation, interference from electromagnetic waves radiated by the first active functional circuit around to susceptors in all directions can be reduced. When the first active functional circuit serves as a susceptor, in this implementation, interference from interference sources in all directions around the first active functional circuit to the first active functional circuit can be reduced. Therefore, regardless of a quantity of functional circuits included in the die 302 and locations of the functional circuits, in implementation 1, electromagnetic interference in all directions around the first active functional circuit can be reduced, thereby improving electromagnetic isolation between an interference source and a susceptor in the die 302.

Figure 7:
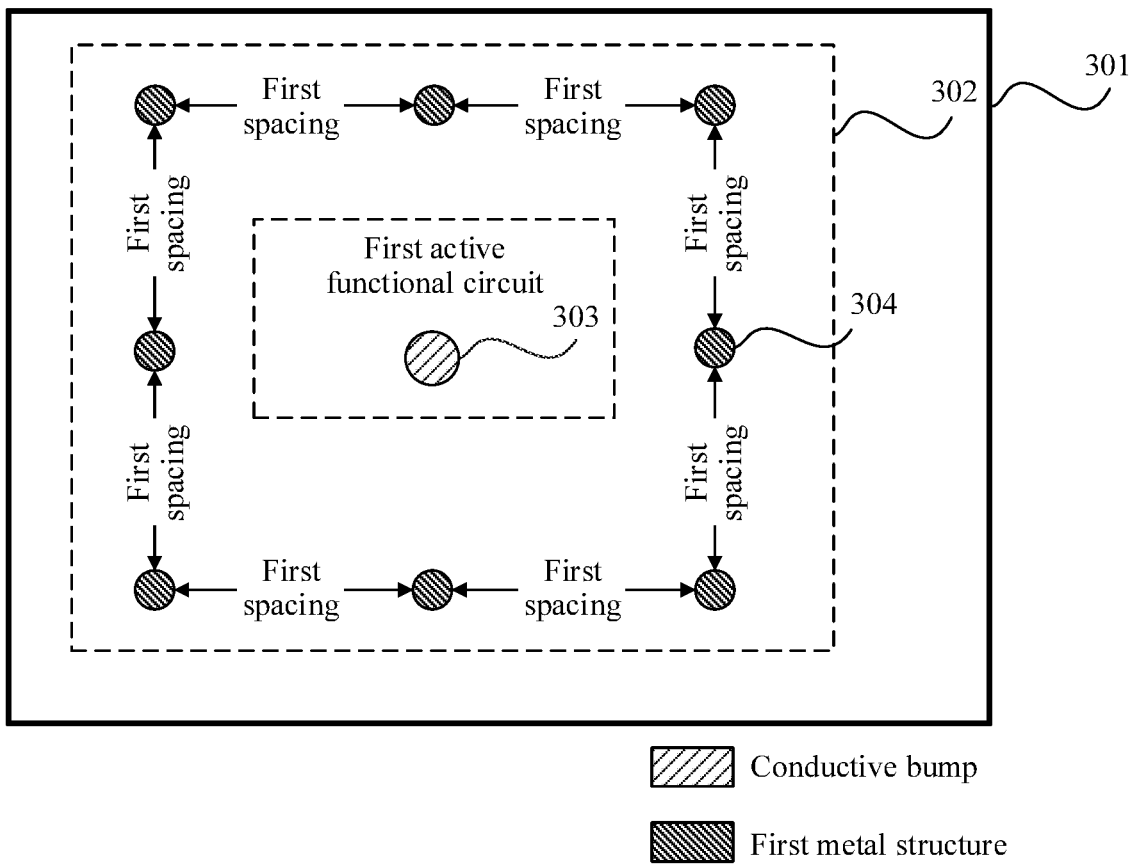
FIG. 7 is a schematic diagram of the third location relationship between first metal rods and a conductive bump according to an embodiment of this application.

For example, in implementation 1, the location relationship between the first metal rods and the conductive bump may be shown in FIG. 7. There are eight first metal rods, and the eight first metal rods are sequentially arranged around the first active functional circuit at equal intervals of the first spacing, and a spacing between any two adjacent first metal rods is the first spacing.

Figure 8:
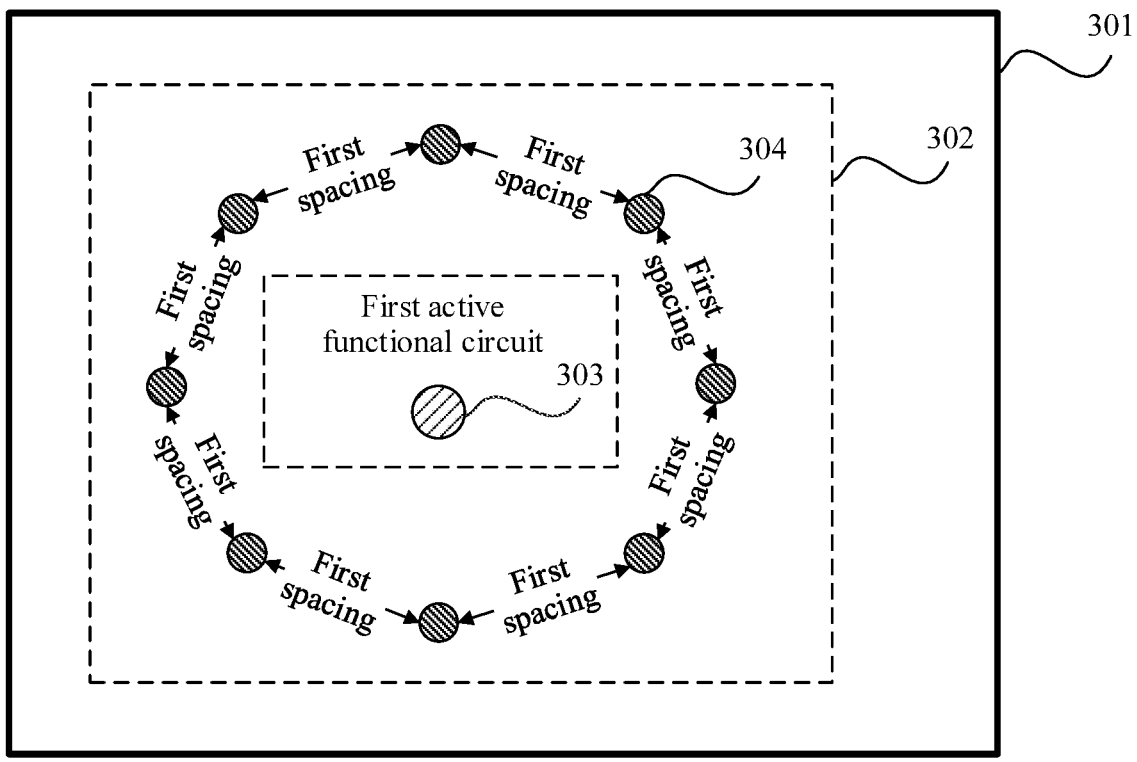
FIG. 8 is a schematic diagram of the fourth location relationship between first metal rods and a conductive bump according to an embodiment of this application.

For example, in implementation 1, the location relationship between the first metal rods and the conductive bump may be shown in FIG. 8. There are eight first metal rods, and the eight first metal rods are sequentially arranged around the first active functional circuit at equal intervals of the first spacing, and a spacing between any two adjacent first metal rods is the first spacing.

It can be learned through comparison between FIG. 7 and FIG. 8 that a difference between the implementation shown in FIG. 8 and the implementation shown in FIG. 7 is as follows. In FIG. 8, distances between all first metal rods and the first active functional circuit are the same, that is, distances between all the first metal rods and the conductive bump 303 are the same. In the implementation shown in FIG. 8, electromagnetic interference between the first active functional circuit and other active functional circuits can be reduced more evenly.

Implementation 2:

The plurality of first metal rods may be arranged around the first active functional circuit in the following manner. The plurality of first metal rods are arranged around the first active functional circuit in a region in which magnetic field strength is greater than a preset value.

In implementation 2, a concept of the magnetic field strength is involved. To explain the concept of the magnetic field strength, a concept of an electromagnetic coupling path of the first active functional circuit is first explained. The electromagnetic coupling path of the first active functional circuit is a path in which the first active functional circuit radiates or receives electromagnetic waves or an electromagnetic wave. Theoretically, provided that there is another interference source or susceptor in the die 302, each direction of radiation centered on the first active functional circuit can be considered as an electromagnetic coupling path of the first active functional circuit, except that magnetic field strength in some directions is relatively strong, and magnetic field strength in some directions is relatively weak.

For example, the die 302 includes the first active functional circuit and an active functional circuit P, the first active functional circuit serves as an interference source, the active functional circuit P serves as a susceptor, and the active functional circuit P is disposed on the right side of the first active functional circuit. In this case, for the first active functional circuit, each direction of radiation centered on the first active functional circuit may be considered as an electromagnetic coupling path of the first active functional circuit. However, because the susceptor, that is, the active functional circuit P is disposed on the right side of the first active functional circuit, compared with a left region of the first active functional circuit, a right region has stronger magnetic field strength generated by electromagnetic interference between an interference source and a susceptor, that is, magnetic field strength on the right side of the first active functional circuit is greater than magnetic field strength on the left side of the first active functional circuit.

In implementation 2, the plurality of first metal rods are disposed in the region in which the magnetic field strength is greater than the preset value, to reduce electromagnetic interference in the region in which the magnetic field strength is relatively strong (for example, the right region of the first active functional circuit in the foregoing example). The preset value may be set based on a requirement.

It is easy to imagine that through setting of the preset value, the plurality of first metal rods may be arranged in the foregoing "half surrounding" arrangement manner. That is, the plurality of first metal rods may be arranged around the first active functional circuit only in some directions (that is, directions in which magnetic field strength is relatively strong) of the first active functional circuit. In implementation 2, the plurality of first metal rods are disposed in the region in which the magnetic field strength is greater than the preset value. Therefore, electromagnetic interference in the region in which the magnetic field strength is relatively strong can be reduced using the plurality of first metal rods. When the first active functional circuit serves as an interference source, in this implementation, interference from an electromagnetic wave radiated by the first active functional circuit to a susceptor in the region in which the magnetic field strength is relatively strong can be reduced. When the first active functional circuit serves as a susceptor, in this implementation, interference from an interference source in the region in which the magnetic field strength is relatively strong around the first active functional circuit to the first active functional circuit can be reduced. In conclusion, in implementation 2, electromagnetic interference in the region in which the magnetic field strength is relatively strong around the first active functional circuit can be reduced, thereby improving electromagnetic isolation between an interference source and a susceptor in the die 302.

It can be easily learned that in comparison with implementation 1, in implementation 2, a quantity of first metal rods in the first metal structure 304 is reduced. Therefore, in implementation 2, the flip-chip die package structure can be simplified such that space of the package structure is reduced, and the implementation is also simpler.

Figure 9:
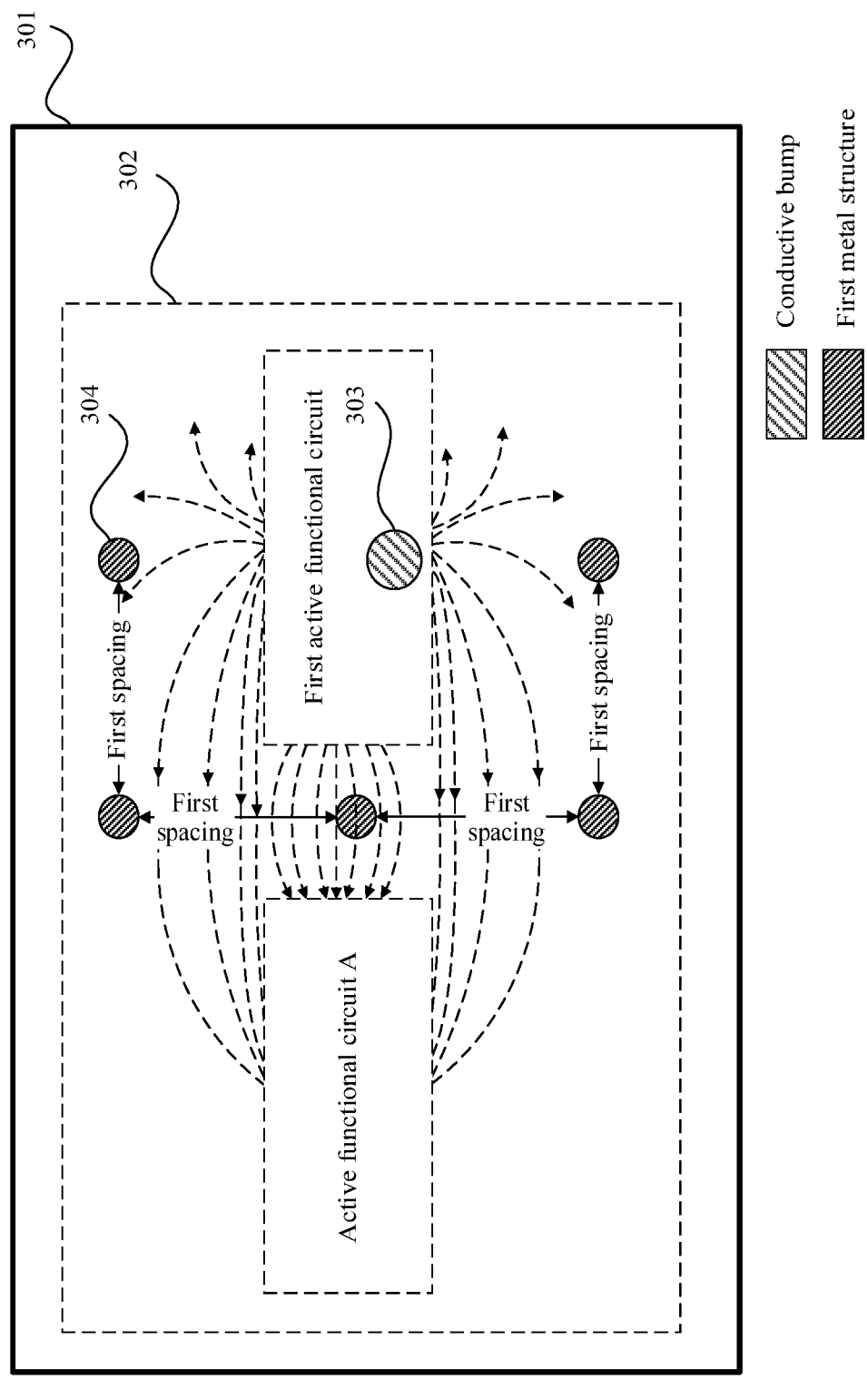
FIG. 9 is a schematic diagram of the fifth location relationship between first metal rods and a conductive bump according to an embodiment of this application.

For example, in implementation 2, the location relationship between the first metal rods and the conductive bump may be shown in FIG. 9. In FIG. 9, there are five first metal rods, another active functional circuit (that is, an active functional circuit A in FIG. 9) is disposed on the left side of the first active functional circuit, and the five first metal rods are disposed on the left side of the first active functional circuit. In FIG. 9, the first active functional circuit is an interference source, the source switching node A is a susceptor, and dashed arrows represent electromagnetic coupling paths of the first active functional circuit. Denser magnetic lines in electromagnetic coupling paths indicate stronger magnetic field strength of the region. It can be easily learned from FIG. 9 that magnetic field strength on the left side of the first active functional circuit is relatively strong, and magnetic field strength on the right side of the first active functional circuit is relatively weak. Therefore, in implementation 2, the plurality of first metal rods may be disposed only in the region (that is, the left side of the first active functional circuit) in which the magnetic field strength is greater than the preset value.

Figure 10:
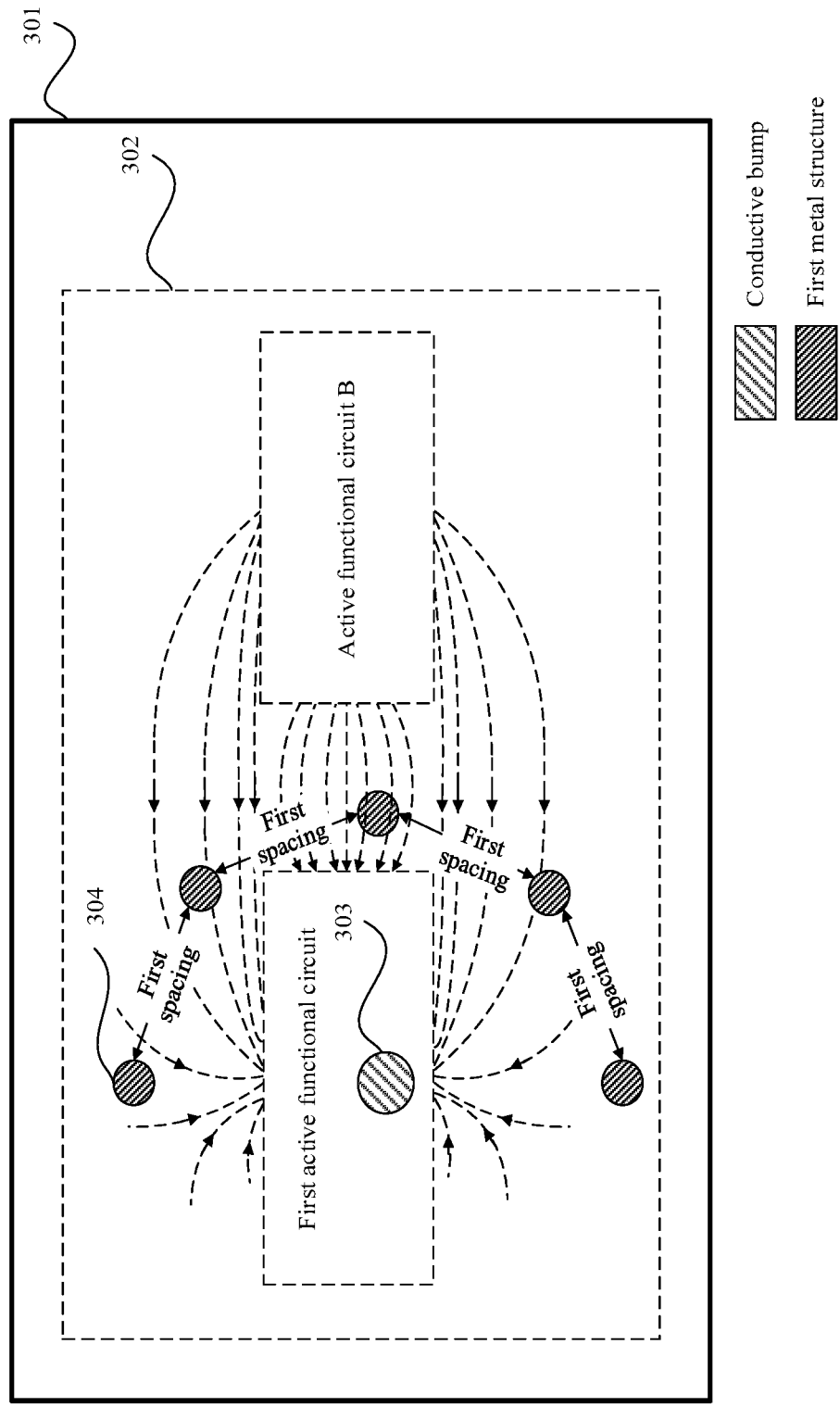
FIG. 10 is a schematic diagram of the sixth location relationship between first metal rods and a conductive bump according to an embodiment of this application.

For example, in implementation 2, the location relationship between the first metal rods and the conductive bump may be shown in FIG. 10. In FIG. 10, there are five first metal rods, another active functional circuit (that is, an active functional circuit B in FIG. 10) is disposed on the right side of the first active functional circuit, and the five first metal rods are disposed on the right side of the first active functional circuit. In FIG. 10, the first active functional circuit is a susceptor, the active functional circuit B is an interference source, and dashed arrows represent electromagnetic coupling paths of the first active functional circuit. Denser magnetic lines in electromagnetic coupling paths indicate stronger magnetic field strength of the region. It can be easily learned from FIG. 10 that magnetic field strength on the right side of the first active functional circuit is relatively strong, and magnetic field strength on the left side of the first active functional circuit is relatively weak. In implementation 2, the plurality of first metal rods may be disposed only in the region (that is, the right side of the first active functional circuit) in which the magnetic field strength is greater than the preset value.

It can be learned through comparison between FIG. 9 and FIG. 10 that a difference between the implementation shown in FIG. 10 and the implementation shown in FIG. 9 is as follows. In FIG. 10, distances between all first metal rods and the first active functional circuit are the same, that is, distances between all the first metal rods and the conductive bump 303 (configured to connect the first active functional circuit and the substrate 301) are the same. In the implementation shown in FIG. 10, electromagnetic interference between the first active functional circuit and other active functional circuits can be reduced more evenly.

In addition, in this embodiment of this application, the flip-chip die package structure 300 may further include a second active functional circuit, and the second active functional circuit is a circuit with an electromagnetic radiation capability or an electromagnetic receiving capability in the die 302.

That is, after the first metal structure is disposed for the first active functional circuit in the package structure, a corresponding metal structure may not be disposed for the second active functional circuit. Because the first metal structure has been disposed around the first active functional circuit, the first metal structure can reduce electromagnetic interference in a transmission or receiving path of an electromagnetic wave. Even if no metal structure is disposed around the second active functional circuit, electromagnetic interference between the second active functional circuit and the first active functional circuit is reduced in comparison with an existing solution.

Certainly, in this embodiment of this application, to further improve electromagnetic isolation between an interference source and a susceptor, a second metal structure may also be disposed for the second active functional circuit. For disposing the second metal structure, refer to related descriptions of the first metal structure. Details are not described herein again.

Further, if the die 302 includes a plurality of interference sources and a plurality of susceptors, corresponding metal structures may be disposed for each interference source and each susceptor. A metal structure disposed for an interference source can reduce electromagnetic interference from the interference source to another susceptor, and a metal structure disposed for a susceptor can reduce electromagnetic interference from an interference source to the susceptor such that electromagnetic isolation between an interference source and a susceptor can be improved.

With reference to the foregoing description of the flip-chip die package structure 300 provided in this embodiment of this application, the following provides several specific examples of the flip-chip die package structure.

Figure 11:
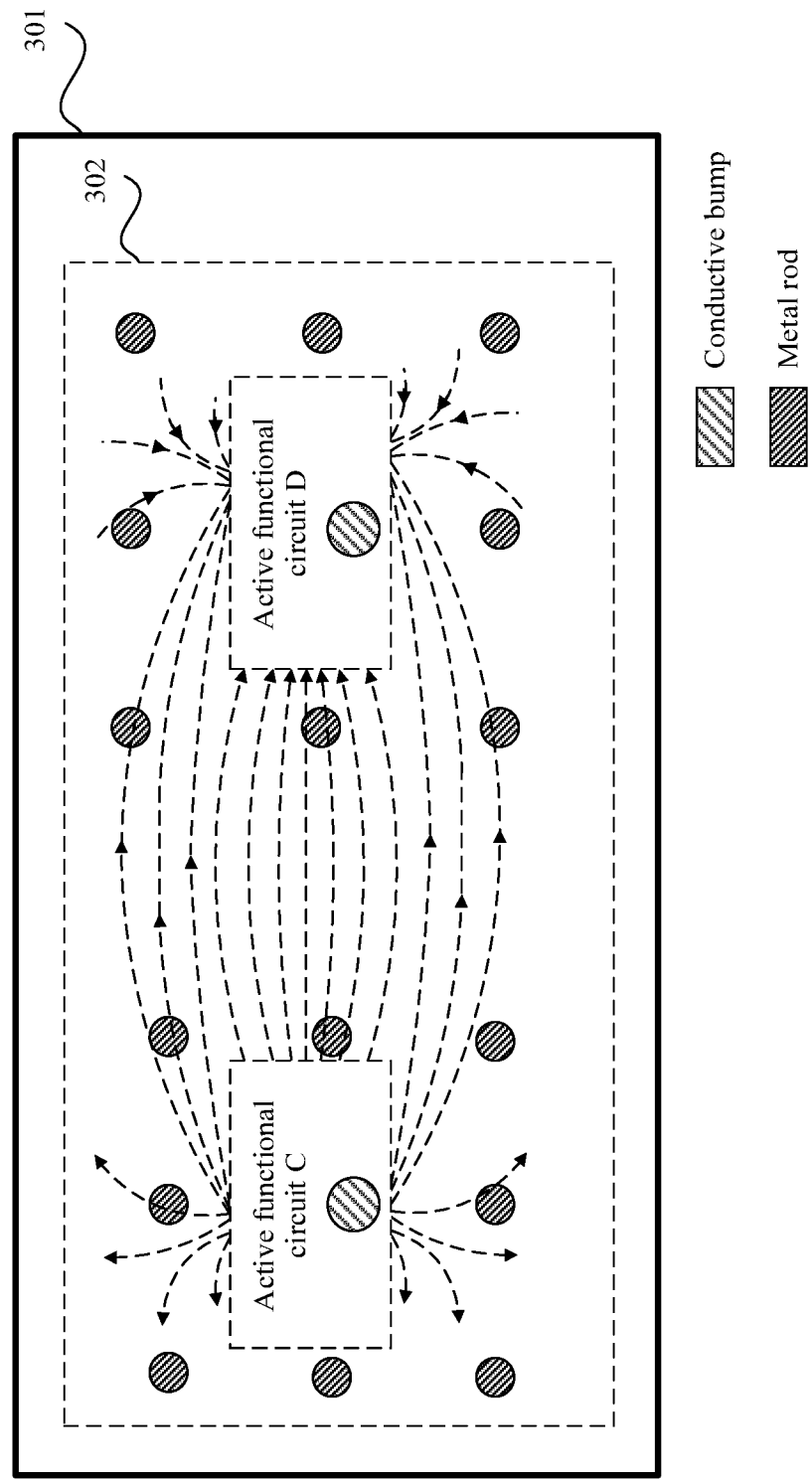
FIG. 11 is a schematic diagram of the first location relationship between metal rods and a conductive bump according to an embodiment of this application.

One example may be as follows. If the die 302 includes one active functional circuit C with an electromagnetic radiation capability and one active functional circuit D with an electromagnetic receiving capability, after metal structures are disposed for both an interference source and a susceptor, the flip-chip die package structure 300 may be shown in FIG. 11. In FIG. 11, in each of metal structures disposed for the two active functional circuits, a plurality of metal rods is arranged in the manner described in implementation 1. Distances between metal rods are different in the two metal structures disposed for the two active functional circuits. In FIG. 11, dashed arrows represent electromagnetic coupling paths between the active functional circuit C and the active functional circuit D.

Figure 12:
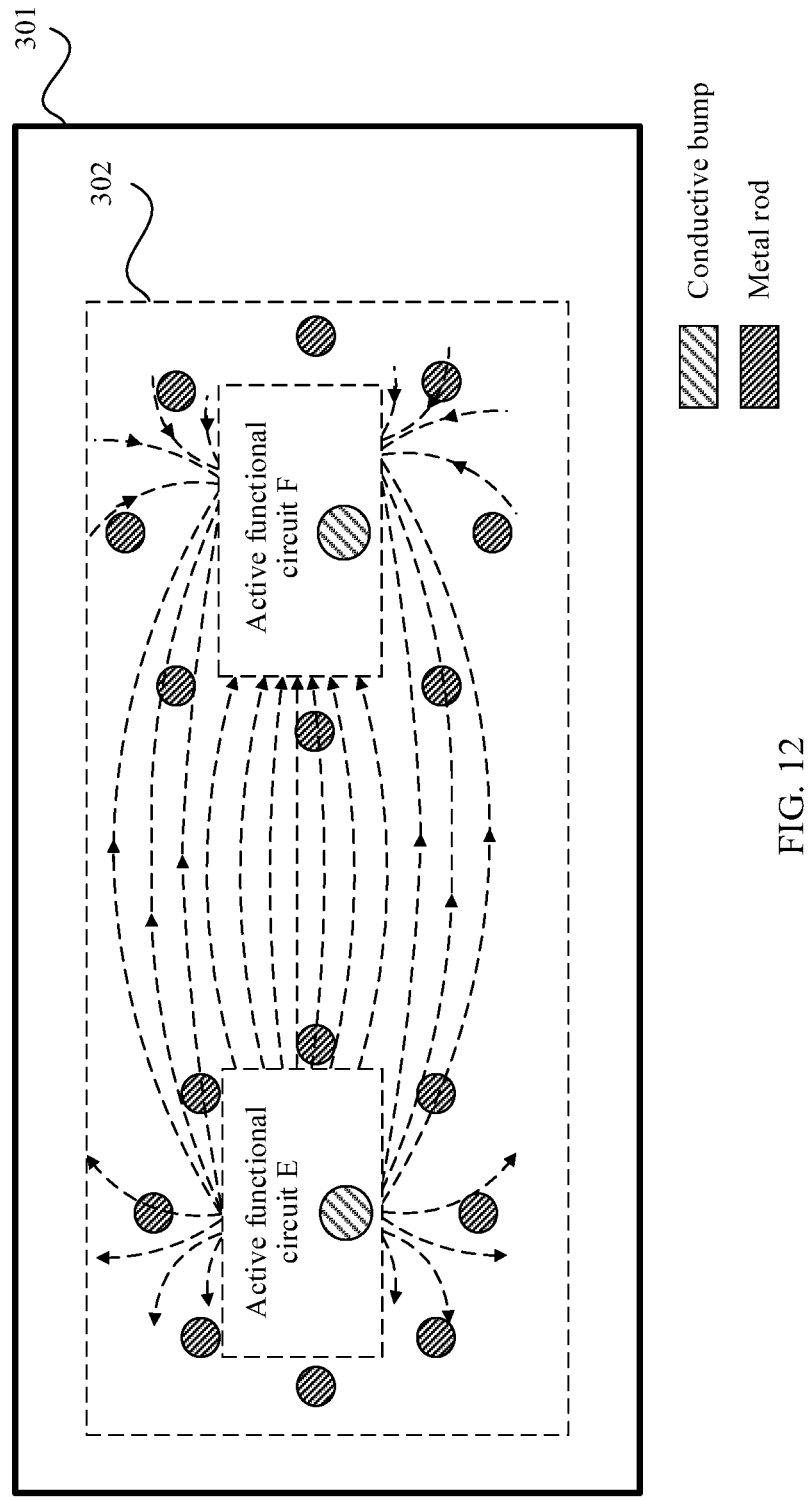
FIG. 12 is a schematic diagram of the second location relationship between metal rods and a conductive bump according to an embodiment of this application.

Another example may be as follows. If the die 302 includes one active functional circuit E with an electromagnetic radiation capability and one active functional circuit F with an electromagnetic receiving capability, after metal structures are disposed for both an interference source and a susceptor, the flip-chip die package structure 300 may be shown in FIG. 12. In FIG. 12, in each of metal structures disposed for the two active functional circuits, a plurality of metal rods is arranged in the manner described in implementation 1, and distances between a plurality of metal rods disposed for an active functional circuit and the active functional circuit are the same. In addition, distances between metal rods are different in the two metal structures disposed for the two active functional circuits. In FIG. 12, dashed arrows represent electromagnetic coupling paths between the active functional circuit E and the active functional circuit F.

Figure 13:
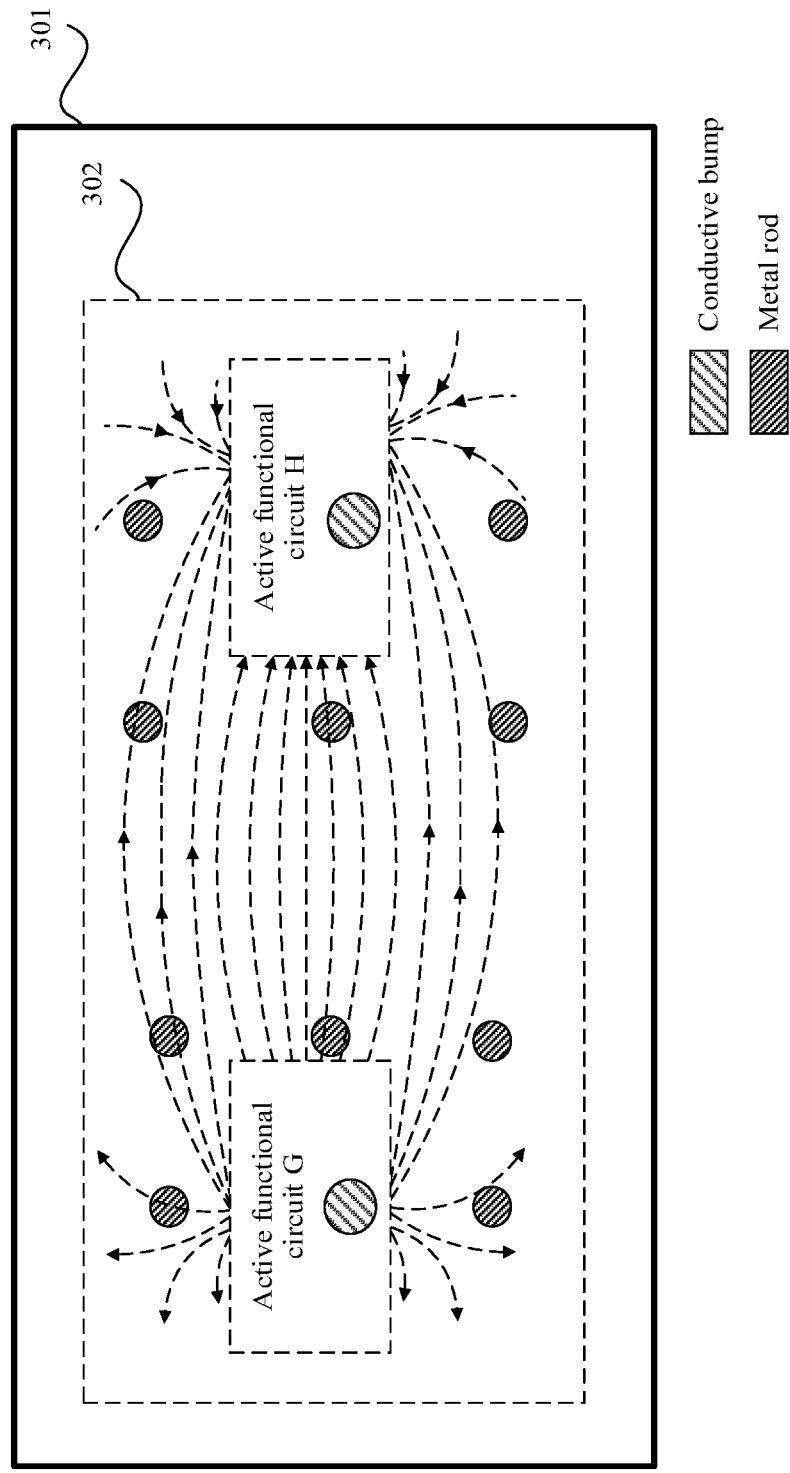
FIG. 13 is a schematic diagram of the third location relationship between metal rods and a conductive bump according to an embodiment of this application.

Another example may be as follows. If the die 302 includes one active functional circuit G with an electromagnetic radiation capability and one active functional circuit H with an electromagnetic receiving capability, after metal structures are disposed for both an interference source and a susceptor, the flip-chip die package structure 300 may be shown in FIG. 13. In FIG. 13, in each of metal structures disposed for the two active functional circuits, a plurality of metal rods is arranged in the manner described in implementation 2. Distances between metal rods are different in the two metal structures disposed for the two active functional circuits. In FIG. 13, dashed arrows represent electromagnetic coupling paths between the active functional circuit G and the active functional circuit H.

Figure 14:
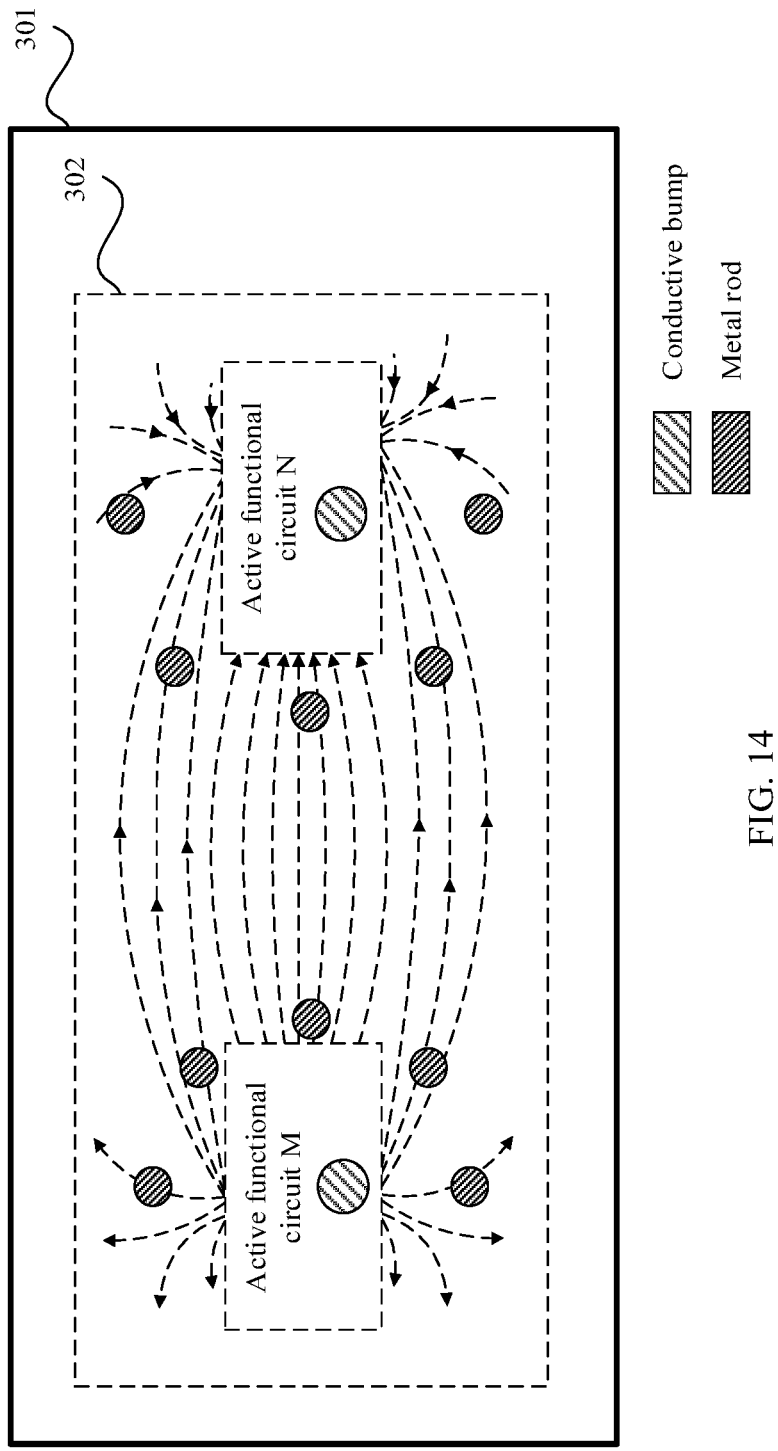
FIG. 14 is a schematic diagram of the fourth location relationship between metal rods and a conductive bump according to an embodiment of this application.

Still another example may be as follows. If the die 302 includes one active functional circuit M with an electromagnetic radiation capability and one active functional circuit N with an electromagnetic receiving capability, after metal structures are disposed for both an interference source and a susceptor, the flip-chip die package structure 300 may be shown in FIG. 14. In FIG. 14, in each of metal structures disposed for the two active functional circuits, a plurality of metal rods is arranged in the manner described in implementation 2, and distances between a plurality of metal rods disposed for an active functional circuit and the active functional circuit are the same. Distances between metal rods are different in the two metal structures disposed for the two active functional circuits. In FIG. 14, dashed arrows represent electromagnetic coupling paths between the active functional circuit M and the active functional circuit N.

In conclusion, according to the flip-chip die package structure 300 provided in this embodiment of this application, the plurality of first metal rods are arranged around the first active functional circuit, and the plurality of first metal rods can change the resonance characteristic of the resonant cavity formed between the substrate 301, the die 302, and the conductive bump 303. When the first active functional circuit serves as an interference source, the first metal structure 304 can reduce electromagnetic interference from the first active functional circuit to another functional circuit (for example, a susceptor) in the die 302. When the first active functional circuit serves as a susceptor, the first metal structure 304 can reduce electromagnetic interference from another functional circuit (for example, an interference source) to the first active functional circuit in the die 302. Therefore, according to the flip-chip die package structure provided in this embodiment of this application, interference from an interference source to a susceptor in the die 302 can be reduced, and electromagnetic isolation between the interference source and the susceptor can be improved.

Figure 15:
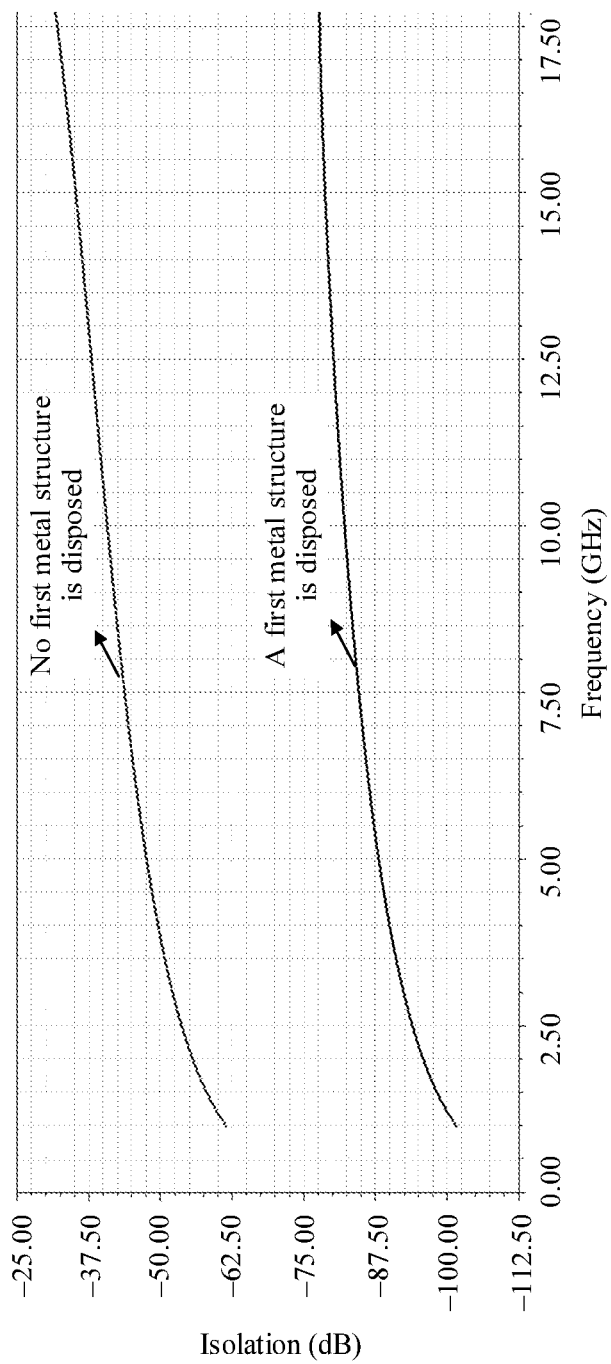
FIG. 15 is a schematic diagram of comparison of electromagnetic isolation between an interference source and a susceptor according to an embodiment of this application.

For example, FIG. 15 may show comparison of electromagnetic isolation between an interference source and a susceptor in a die when a first metal structure is disposed and no first metal structure is disposed in a flip-chip die package structure. It can be learned from FIG. 15 that electromagnetic isolation between an interference source and a susceptor can be improved using the solution, provided in the embodiments of this application, in which the first metal structure is disposed.

Based on the foregoing embodiments, this application further provides an electronic device. The electronic device may include the flip-chip die package structure 300 described in any one of the foregoing embodiments. The electronic device includes but is not limited to a terminal device such as a smartphone, a smart TV, a smart TV set-top box, a PC, a wearable device, or an intelligent broadband device, a telecommunications device such as a wireless network, a fixed network, or a server, and an electronic device such as a die module or a memory.

Figure 16:
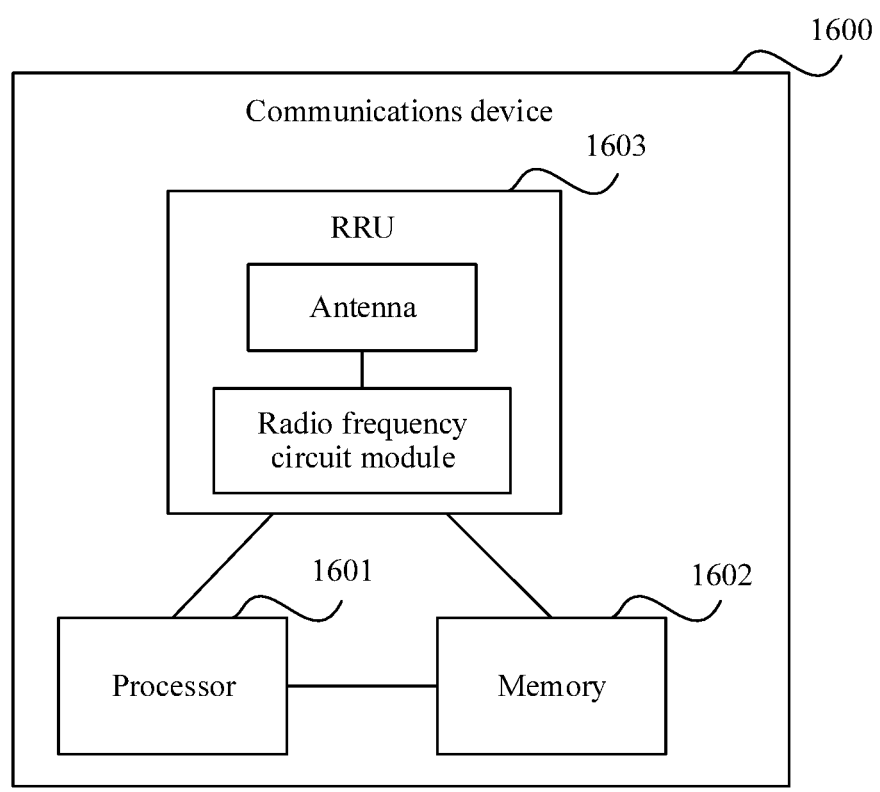
FIG. 16 is a schematic structural diagram of a communications device according to an embodiment of this application.

For example, an embodiment of this application provides a communications device. Referring to FIG. 16, the communications device 1600 includes a processor 1601, a memory 1602, and one or more remote radio units (RRU). The processor 1601 is mainly configured to process a communication protocol and communication data, control the communications device 1600, execute a software program, and process data of the software program. The memory 1602 is mainly configured to store a software program and data. The RRU may include a radio frequency circuit module and an antenna. The radio frequency circuit module is mainly configured to convert and process a radio frequency signal. The antenna is mainly configured to receive and transmit a radio frequency signal in an electromagnetic wave form.

A die in the radio frequency circuit module may use the flip-chip die package structure 300 provided in the embodiments of this application such that when the communications device 1600 performs data transceiving, electromagnetic interference from an interference source to a susceptor in the radio frequency circuit module is reduced, thereby improving data transceiving accuracy.

Obviously, persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. A flip-chip die package structure, comprising:
   a die;
   a substrate;
   a plurality of conductive bumps electrically coupling an upper surface of the die and a second surface of the substrate, wherein the upper surface comprises a die solder pad, and wherein the second surface faces the die; and
   a first metal structure comprising a plurality of first metal rods disposed between the substrate and the die,
   wherein each of the plurality of first metal rods is electrically coupled to the substrate and the die,
   wherein the plurality of first metal rods are arranged around a first active functional circuit, and
   wherein the first active functional circuit is a circuit with an electromagnetic radiation capability or an electromagnetic receiving capability in the die.

2. The flip-chip die package structure of claim 1, further comprising a filling layer configured to convert an electromagnetic wave radiated or received by the first active functional circuit into a thermal energy.

3. The flip-chip die package structure of claim 1, further comprising a filling layer comprising an electromagnetic loss particle configured to convert an electromagnetic wave radiated or received by the first active functional circuit into a thermal energy.

4. The flip-chip die package structure of claim 1, wherein the plurality of first metal rods are sequentially arranged around the first active functional circuit at equal intervals of a first spacing.

5. The flip-chip die package structure of claim 4, wherein the first spacing is less than one tenth of a wavelength of an electromagnetic wave radiated or received by the first active functional circuit.

6. The flip-chip die package structure of claim 4, wherein the first plurality of metal rods surround the first active functional circuit.

7. The flip-chip die package structure of claim 1, wherein the plurality of first metal rods are arranged around the first active functional circuit in a region in which a magnetic field strength is greater than a preset value.

8. The flip-chip die package structure of claim 1, further comprising a second active functional circuit with an electromagnetic radiation capability or an electromagnetic receiving capability in the die.

9. The flip-chip die package structure of claim 8, further comprising a second metal structure comprising a plurality of second metal rods, wherein each of the plurality of second metal rods is disposed between the substrate and the die and is electrically coupled to the substrate and the die, and wherein the plurality of second metal rods are arranged around the second active functional circuit.

10. The flip-chip die package structure of claim 1, wherein the die solder pad is coupled to an input/output pin of the die to input or output an electrical signal.

11. An electronic device comprising:
    a flip-chip die package structure comprising:
    a die;
    a substrate;
    a plurality of conductive bumps electrically coupling an upper surface of the die and a second surface of the substrate, wherein the upper surface comprises a die solder pad, and wherein the second surface faces the die; and
    a first metal structure comprising a plurality of first metal rods disposed between the substrate and the die,
    wherein each of the plurality of first metal rods is electrically coupled to the substrate and the die, wherein the plurality of first metal rods are arranged around a first active functional circuit, and wherein the first active functional circuit is a circuit with an electromagnetic radiation capability or an electromagnetic receiving capability in the die.

12. The electronic device of claim 11, wherein the flip-chip die package structure further comprises a filling layer configured to convert an electromagnetic wave radiated or received by the first active functional circuit into a thermal energy.

13. The electronic device of claim 11, wherein the flip-chip die package structure further comprises a filling layer comprising an electromagnetic loss particle, and wherein the electromagnetic loss particle is configured to convert an electromagnetic wave radiated or received by the first active functional circuit into a thermal energy.

14. The electronic device of claim 11, wherein the plurality of first metal rods are sequentially arranged around the first active functional circuit at equal intervals of a first spacing.

15. The electronic device of claim 14, wherein the first spacing is less than one tenth of a wavelength of an electromagnetic wave radiated or received by the first active functional circuit.

16. The electronic device of claim 14, wherein the plurality of first metal rods are configured to surround the first active functional circuit.

17. The electronic device of claim 11, wherein the plurality of first metal rods are arranged around the first active functional circuit in a region in which a magnetic field strength is greater than a preset value.

18. The electronic device of claim 11, wherein the flip-chip die package structure further comprises a second active functional circuit, and wherein the second active functional circuit is a circuit with an electromagnetic radiation capability or an electromagnetic receiving capability in the die.

19. The electronic device of claim 18, wherein the flip-chip die package structure further comprises a second metal structure comprising a plurality of second metal rods, wherein each of the plurality of second metal rods is disposed between the substrate and the die, and is electrically coupled to the substrate and the die, and wherein the plurality of second metal rods are arranged around the second active functional circuit.

20. The electronic device of claim 11, wherein the die solder pad is coupled to an input/output pin of the die to input or output an electrical signal.

* * * * *